(12) United States Patent
Farjadrad et al.

(10) Patent No.: US 7,739,558 B1
(45) Date of Patent: Jun. 15, 2010

(54) METHOD AND APPARATUS FOR RECTIFYING ERRORS IN THE PRESENCE OF KNOWN TRAPPING SETS IN ITERATIVE DECODERS AND EXPEDITED BIT ERROR RATE TESTING

(75) Inventors: Ramin Farjadrad, Mountain View, CA (US); Ramin Shirani, Morgan Hill, CA (US)

(73) Assignee: Aquantia Corporation, Milpitas, CA (US)

( * ) Notice: Subject to any disclaimer, the term of this patent is extended or adjusted under 35 U.S.C. 154(b) by 938 days.

(21) Appl. No.: 11/474,158

(22) Filed: Jun. 22, 2006

Related U.S. Application Data

(60) Provisional application No. 60/692,897, filed on Jun. 22, 2005.

(51) Int. Cl.
*G06F 11/00* (2006.01)
*H03M 13/00* (2006.01)

(52) U.S. Cl. .................. 714/704; 714/758; 714/780; 714/800

(58) Field of Classification Search .................. 714/704, 714/758, 780, 800
See application file for complete search history.

(56) References Cited

U.S. PATENT DOCUMENTS

| | | | | |
|---|---|---|---|---|
| 7,058,873 | B2 * | 6/2006 | Song et al. | 714/752 |
| 7,231,577 | B2 * | 6/2007 | Richardson et al. | 714/758 |
| 7,340,671 | B2 * | 3/2008 | Jones et al. | 714/800 |
| 7,433,395 | B2 * | 10/2008 | Sedarat | 375/222 |
| 2005/0144543 | A1 * | 6/2005 | Choi et al. | 714/704 |
| 2005/0193320 | A1 * | 9/2005 | Varnica et al. | 714/800 |

OTHER PUBLICATIONS

C. Jones, A. Matache, T.Tian, J. Villasenor and R. Wesel, "LDPC Codes—University Good for Wireless Channels," Proceedings of the Military Communications Conference, Oct. 2003.*
C. Jones, T. Tian, A. Matache, R. Wesel and J. Villasenor, "Robustness of LDPC Codes on Periodic Fading Channels," Proceedings of GlobeCom, Nov. 2002.*
L. Dong-U, J. Villasenor, and W. Luk, "A Hardware Gaussian Noise Generator for Exploring Channel Code Behavior At Very Low Bit Error Rates," in Proceedings of FCCM, May 2003.*
Richardson, Tom, *Error Floors of LDPC Codes*, pp. 1426-1435, Flarion Technologies, Bedminster, NJ 07921.
Winstead, Chris, *Fast BER Simulation: Using Importance Sampling in Error Control Systems*, Mar. 27, 2003, pp. 1-14.

* cited by examiner

*Primary Examiner*—James C Kerveros
(74) *Attorney, Agent, or Firm*—Sawyer Law Group, P.C.

(57) ABSTRACT

A method and system for determining low error rate behavior of a device are provided. In one implementation, the method includes obtaining a dominant trapping set of a code, the dominant trapping set containing a plurality of variable nodes, and biasing bits associated with a programmable transmitter that is in communication with the device. The biased bits correspond to the variable nodes of the dominant trapping set. The method further includes transmitting random data from the programmable transmitter to the device, in which the random data includes one or more of the biased bits; measuring a number of error events corresponding to biased bits received by the device that cannot be decoded; and determining a true bit error rate of the device based on the measured number of error events.

22 Claims, 7 Drawing Sheets

METHOD AND APPARATUS FOR RECTIFYING ERRORS IN THE PRESENCE OF KNOWN TRAPPING SETS IN ITERATIVE DECODERS AND EXPEDITED BIT ERROR RATE TESTING

CROSS-REFERENCE TO RELATED APPLICATIONS

This application claims benefit under 35 USC 119(e) of Provisional Application No. 60/692,897, filed on Jun. 22, 2005. This application is related to U.S. patent application Ser. No. 12/329,514, entitled, "TRAPPING SET DECODING FOR TRANSMISSION FRAMES," filed Dec. 5, 2008 and assigned to the assignee of the present invention.

FIELD OF THE INVENTION

The present invention relates generally to data communications, and more particularly to bit error rate testing in data communications.

BACKGROUND OF THE INVENTION

The process of information transfer for communication and storage devices typically entails transmission and reception of data over a particular media. The transmission media can be, for example, copper wires, fiber optics, air, or magnetic recording/detection in the case of storage media like a read channel. Given the ever increasing need for more information transfer (or more information storage), the process of information transfer is subject to data corruption. Error control codes, however, permit communication and storage information to be transferred with an arbitrarily low probability of error. For example, iterative error control decoding algorithms provide error protection that nears the Shannon limit. The Shannon limit has long been known as a bound on the performance of error control systems, as described in "Elements of Information Theory", by Thomas M. Cover and Joy A. Thomas, published by John Wiley, 1991, and "A Mathematical Theory of Communication" by Claude E. Shannon, The Bell System Technical Journal, July 1948, both of which are incorporated by reference herein. The benefit of an error control system is that error control systems permit error-free transmission with reduced signal energies, or extended range, or increased density in storage media.

Bit error rate (BER) testing has long been the method of choice used to test the robustness and quality of data transmission over media. Commercial bit error rate testers are available from suppliers such as, for example, Agilent or Tektronix. Commercial bit error rate testing entails sending a sequence of information bits from a transmitter to a receiver, and performing data integrity check on the bits received by the receiver. Many transmission protocols (e.g., Ethernet and SONET) require a very high quality of transmission, or in effect, a very low bit error rate. For example, the latest IEEE 802.an 10 GBase-T standard requires a bit error rate of 1E-12. To perform manufacturing test of an end product (e.g., an integrated circuit (IC), a link, or a server blade), and guarantee such a low bit error rate level for the end product is fairly challenging. Given that errors typically occur on a random basis, error-free transmission of 1E12 bits (e.g., in a 10 GBase-T implementation) from a transmitter to a receiver does not necessarily guarantee a 1E-12 bit error rate. During testing of data transmission, the random nature of error events has to be taken into account and, therefore, multiple cycles of 1E12 bit streams need to be sent between the transmitter and the receiver to ascertain the bit error rate performance of the end product. Moreover, if error control codes are used to improve link quality, the robustness of the error control codes can only be exercised through exhaustive testing which may translate to minutes or hours required to test an end product. Such a long time required for testing an end product corresponds to substantial additional cost to the end product. For example, in some cases, the cost may be realized in a limited large volume production of an end product due to there being a limited number of bit error rate testers to test a sufficient number of the end products.

BRIEF SUMMARY OF THE INVENTION

In general, in one aspect, this specification describes a bit error rate test system operable to determine low error rate behavior of a device. The bit error rate test system includes a programmable transmitter to send random data via a channel to the device. The random data contains one or more biased bits that correspond to a trapping set of a code. The bit error rate test system further includes a decoder in communication with the device, in which the decoder measures a number of error events corresponding to received biased bits associated with the random data that cannot decoded. The bit error rate test system further includes a circuit to calculate a true bit error rate of the device based on the measured number of error events.

Implementations can include one or more of the following features. The circuit can comprise a field programmable gate array (FPGA). The circuit can be a part of an external computer system that is in communication with the decoder. The bit error rate test system can further include a random noise generator operable to add noise to an output of the programmable transmitter. The random noise generator can permit a tester to test the low error rate behavior of the device in the presence of additional noise. The device can comprise one of a receiver, an integrated circuit, a system. The channel can be a worst case channel having one or more of high insertion loss, echo, far-end crosstalk (FEXT), and near-end crosstalk (NEXT). The code can comprise a turbo code, or a low density parity check (LDPC code).

In general, in another aspect, this specification describes a method for determining low error rate behavior of a device. The method includes obtaining a dominant trapping set of a code, the dominant trapping set containing a plurality of variable nodes, and biasing bits associated with a programmable transmitter that is in communication with the device. The biased bits correspond to the variable nodes of the dominant trapping set. The method further includes transmitting random data from the programmable transmitter to the device, in which the random data includes one or more of the biased bits; measuring a number of error events corresponding to biased bits received by the device that cannot be decoded; and determining a true bit error rate of the device based on the measured number of error events.

In general, in another aspect, this specification describes a computer readable medium containing program instruction tangibly stored thereon for determining low error rate behavior of a device. The computer readable medium contains instructions for obtaining a dominant trapping set of a code, in which the dominant trapping set contains a plurality of variable nodes; biasing bits associated with a programmable transmitter that is in communication with the device, in which the biased bits corresponding to the variable nodes of the dominant trapping set; transmitting random data from the programmable transmitter to the device, in which the random data including one or more of the biased bits; measuring a number of error events corresponding to biased bits received by the device that cannot be decoded; and determining a true bit error rate of the device based on the measured number of error events.

Implementations can provide one or more of the following advantages. In one implementation, a bit error rate (BER) test system is provided that can obtain low error rate behavior of an end product (e.g., a receiver, or other type of device) in a matter of seconds as compared to hours using conventional bit error rate testers. Accordingly, use of the bit error rate test system can provide for quality assurance of low BER behavior for high volume production.

The details of one or more implementations are set forth in the accompanying drawings and the description below. Other features and advantages will be apparent from the description and drawings.

BRIEF DESCRIPTION OF THE DRAWINGS

Like reference symbols in the various drawings indicate like elements.

DETAILED DESCRIPTION OF THE INVENTION

The present invention relates generally to data communications, and more particularly to bit error rate testing in data communications. The following description is presented to enable one of ordinary skill in the art to make and use the invention and is provided in the context of a patent application and its requirements. Various modifications to implementations and the generic principles and features described herein will be readily apparent to those skilled in the art. Thus, the present invention is not intended to be limited to the implementations shown but is to be accorded the widest scope consistent with the principles and features described herein.

Figure 1:
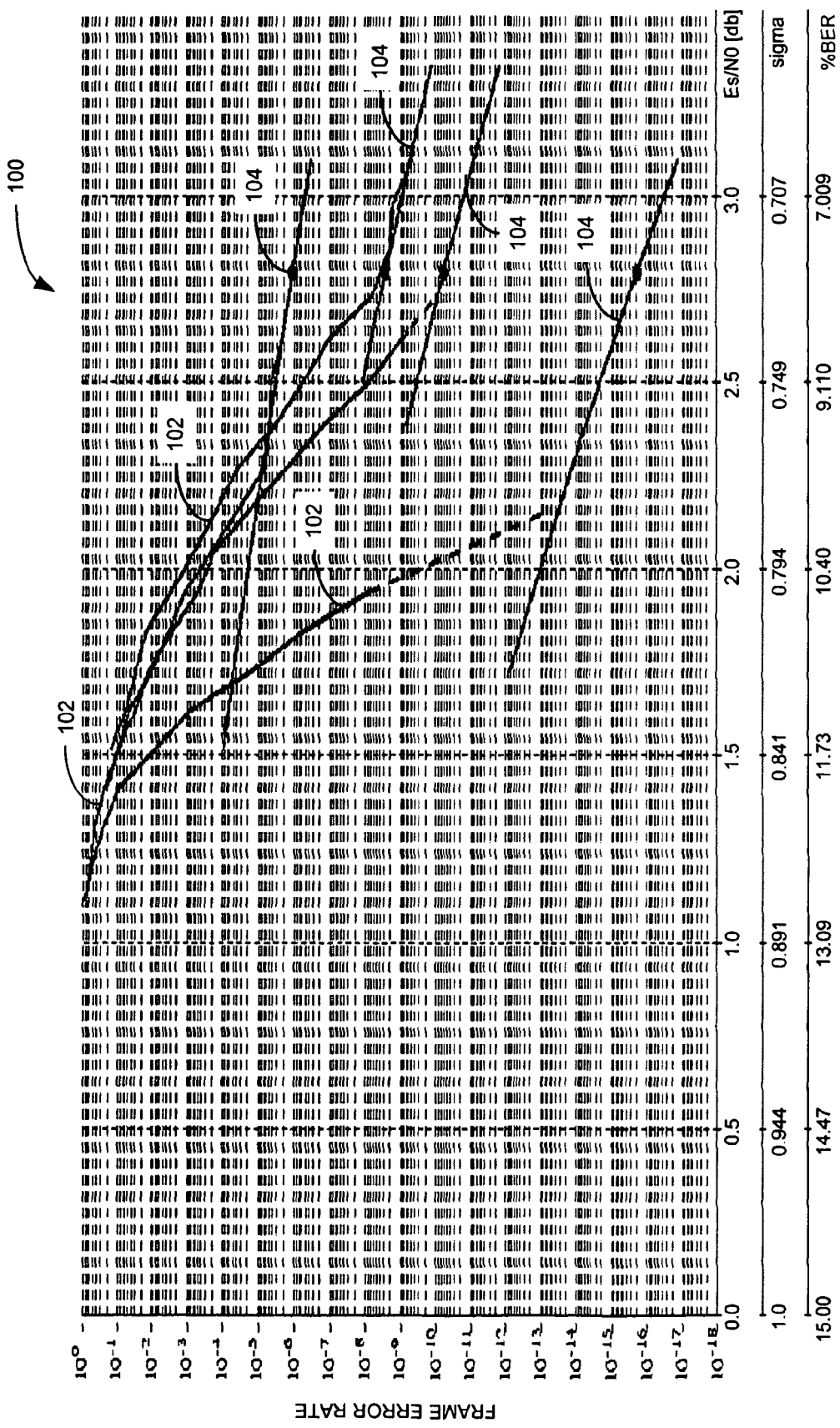
FIG. 1 illustrates waterfall and error floor behavior of iterative error codes.

Performance curves of iterative coding schemes such as, for example, low density parity check (LDPC) codes and turbo codes, are commonly referred to as "waterfall" curves. The bottom of a waterfall curve is often referred to as the error floor. Industry research has explored various methodologies of predicting the error floor for a given code, as described in "Error Floors of LDPC Codes", by Tom Richardson, which is incorporated by reference herein. FIG. 1 illustrates a graph 100 depicting examples of waterfalls 102 and error floors 104. In the error floor region, virtually all failures are due to "near code words", which are also referred to as trapping sets. Trapping sets represent a small number of self-contained variable nodes (with their associated parity check nodes) for which the erasure of information bits (e.g., errors on all these nodes) has a low probability of being rectified through decoding. The low probability of correction of errors on these nodes by a given decoder generally leads to improper decoding scenarios which dictate the error floor of the decoder.

Figure 2A:
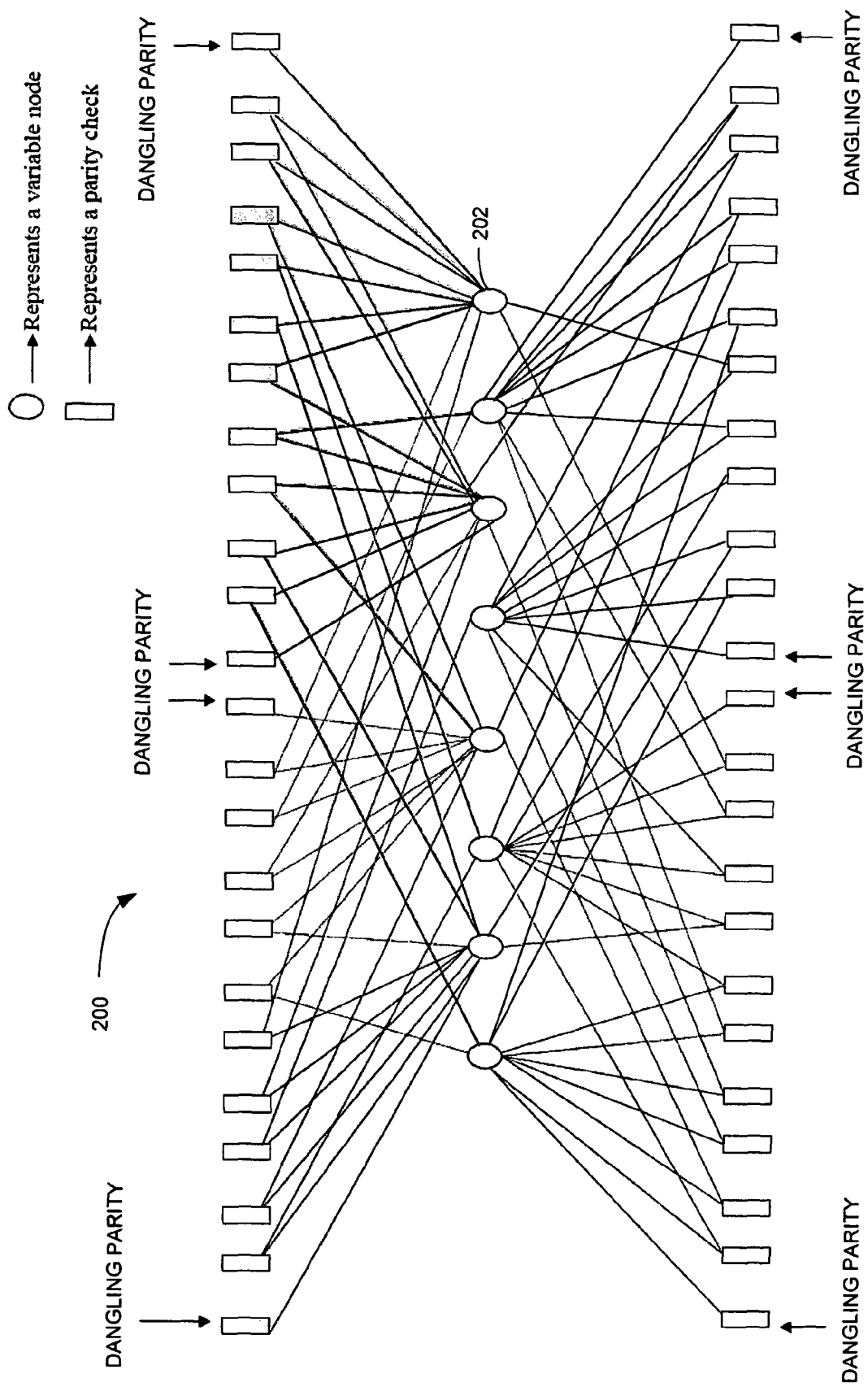
FIGS. 2A-2B illustrate an example of a trapping set structure for a (2048, 1723) low density parity check (LDPC) code.
Figure 2B:
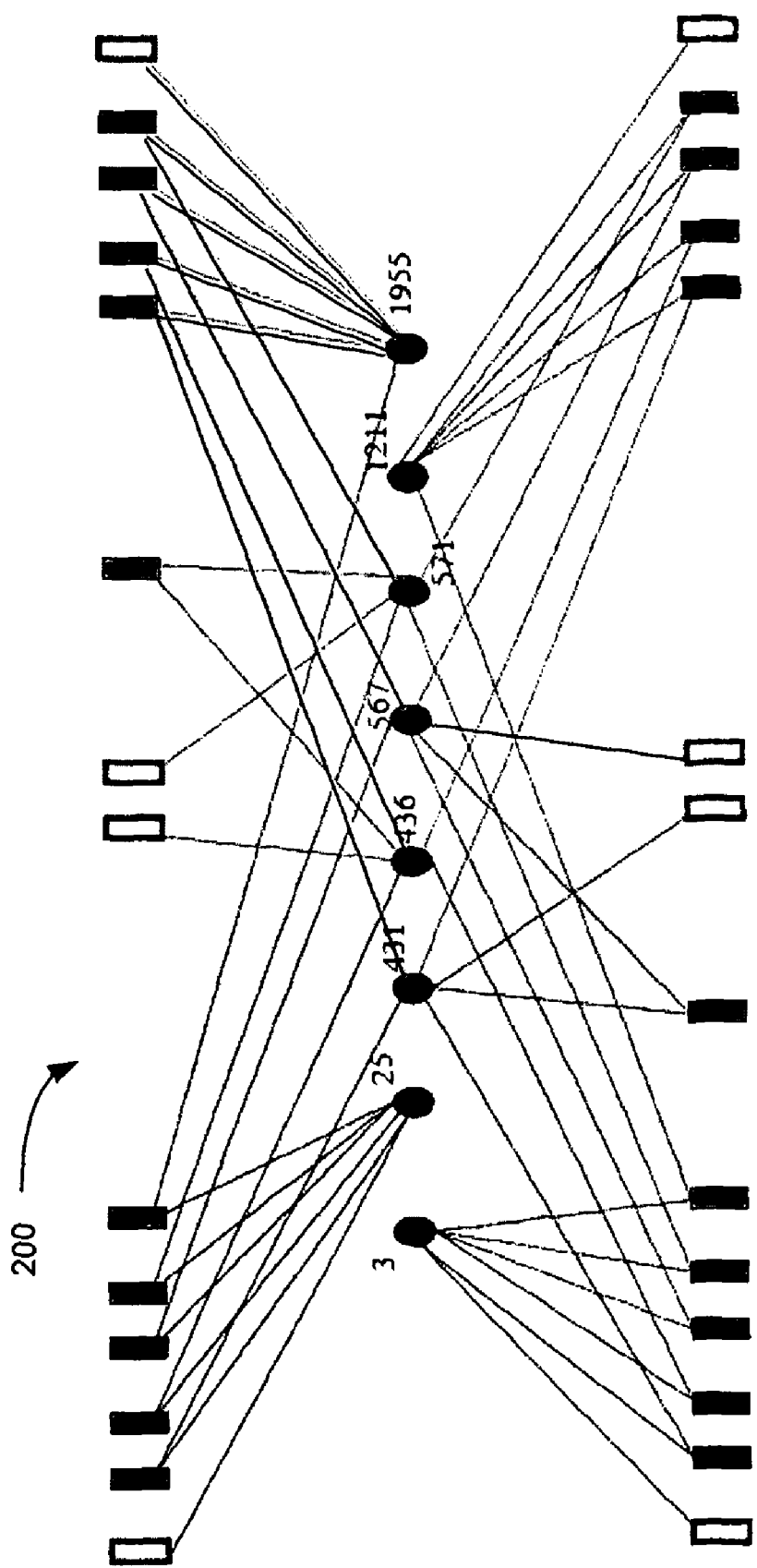

There are different classes of trapping sets for every code. For each class of trapping sets, there are a finite number of equivalent trapping sets whose size and structure are identical (referred to herein as a "dominant trapping set"). For example, referring to FIG. 2A, the 10 GBase-T standard calls for a (2048, 1723) LDPC regular code for which the dominant trapping set 200 is shown. In the example of FIG. 2A, there are eight variable nodes 202 involved in the dominant trapping set 200. The eight variable nodes are coupled to corresponding parity check nodes. As discussed above, the erasure of information on the union of these variable nodes can result in a non-decodable data. FIG. 2B shows another example of the dominant trapping set 200, including example variable node numbers for the dominant trapping set 200 (e.g., bits 3, 25, 431, 436, 567, 571, 1211, 1955). The LDPC code selected for the 802.3 standard is a rate R=0.842 (2048, 1723) high-rate code with a very low error floor. Through extensive simulation, it was found that essentially a unique error pattern causes the code to floor out. This error pattern is a trapping set with eight variable nodes. The trapping set is almost a stopping set, except for the eight check nodes (marked as white check nodes in FIG. 2B) which are not doubly connected to the set of variable nodes. The trapping set causes an error floor around a bit error rate (BER) of about 10E-14.

Fast bit error rate testing simulations using importance sampling is well known in the art, as discussed in "Fast BER Simulation: Using Importance Sampling in Error Control Systems", by Chris Winstead (March 2003), which is incorporated by reference herein. In general, importance sampling is a method to increase the number of significant events in a low event rate testing environment, such as bit error rate testing or simulation. The basic philosophy of importance sampling is based on Monte-Carlo sampling, which selects random samples in order to approximate the probability of certain events. Importance sampling biases data transmission simulation or the channel simulation in such a way that many more errors are produced at a receiver end. With proper biasing (e.g., proper application of a voltage to a trapping set node) in a hardware implementation (e.g., a bit error rate test system), the measured results can be unbiased and an actual bit error rate of a device can be obtained, as discussed in greater detail below.

Figure 3:
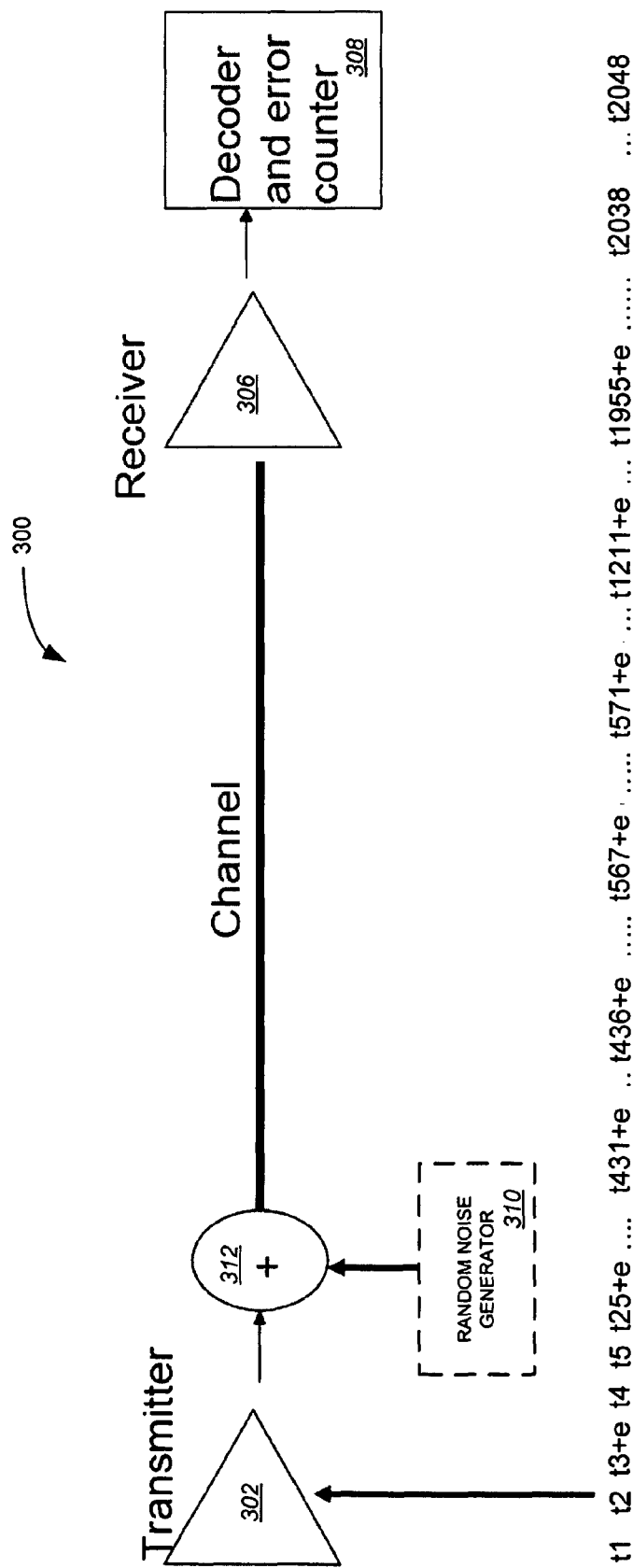
FIG. 3 illustrates a bit error rate test system including a programmable transmitter in accordance with one implementation.

FIG. 3 illustrates a bit error rate test system 300 that incorporates importance sampling techniques in accordance with one implementation of the present invention. In one implementation, the bit error rate test system 300 includes a programmable transmitter 302, a channel (or transmission line) 304, a receiver 306, and a decoder 308. In one implementation, the bits that correspond to variable nodes of a dominant trapping set are first biased through the programmable transmitter 302. In one implementation, the proper biasing (or application of a bias voltage) of bits that correspond to variable nodes of a dominant trapping set (associated with a given code) is determined as follows. First, through analytical or exhaustive simulations, the dominant trapping set of a specific code (e.g., an LDPC code, a turbo code, or other code) is obtained. Other means for obtaining the dominant trapping set can be used, for example, through fast emulation using an FPGA. An example of a dominant trapping set for the (2048, 1723) LDPC code is shown in FIGS. 2A-2B, as discussed above. Second, using simulation and importance sampling techniques, the proper biasing is determined, which biasing is applied to bits (transmitted from the programmable transmitter 302) that correspond to the variable nodes of the dominant trapping set. In the example shown in FIG. 3, bits (3, 25, 431, 436, 567, 571, 1211, and 1955) of the (2048, 1723) LDPC code are biased with a voltage e (e.g., a 600 mV voltage).

Once the selected bits have been biased, the programmable transmitter 302 sends random data to the receiver 306 through the channel 304. The decoder 308 decodes the random data and records the number of error events—i.e., the number of received bits that cannot be decoded. Accordingly, because the bits that correspond to the variable nodes of the dominant trapping set have been biased, the decoder 308 records (or measures) a greater number of error events at a various SNRs (signal-to-noise ratios) relative to the case if none of the bits transmitter from the programmable transmitter 302 were biased. Using importance sampling techniques, the measured results of the decoder 308 are unbiased (e.g., through a mathematical transformation) and the true bit error rate is obtained. Thus, for example, the resulting error floor for a single trapping set is shown in (400) for both an ideal floating point precise LDPC and an analog implementation of the LDPC. This curve was obtained through biased BER vs. SNR measurements and later unbiased through mathematical equations to arrive at the true BER vs. SNR curve for a single trapping set. The specific (2048,1723) code contains many such trapping sets which construction wise are equivalent and lead to same decoding deficiency due to their inherent structure. The actual BER behaviour of the (2048,1723) code would then have the contribution of all such trapping sets which then raises the BER curve toward the lower BER region depending on the exact number of such trapping sets (could go up a 100 fold if 100 such independent trapping sets exist). Using the bit error rate testing system 300, a tester can obtain low error rate behavior of an end product (e.g., a receiver) in a matter of seconds as compared to hours using conventional bit error rate testers. In one implementation, the decoder 308 counts the number of error events and unbiases the error count using hardware (e.g., a field programmable gate array (FPGA) or other suitable circuit). In another implementation, the decoder 308 passes the error count to an external computer (not shown) via a management bus, in which the external computer calculates a true bit error rate based on the measured results of the decoder 308.

Figure 4:
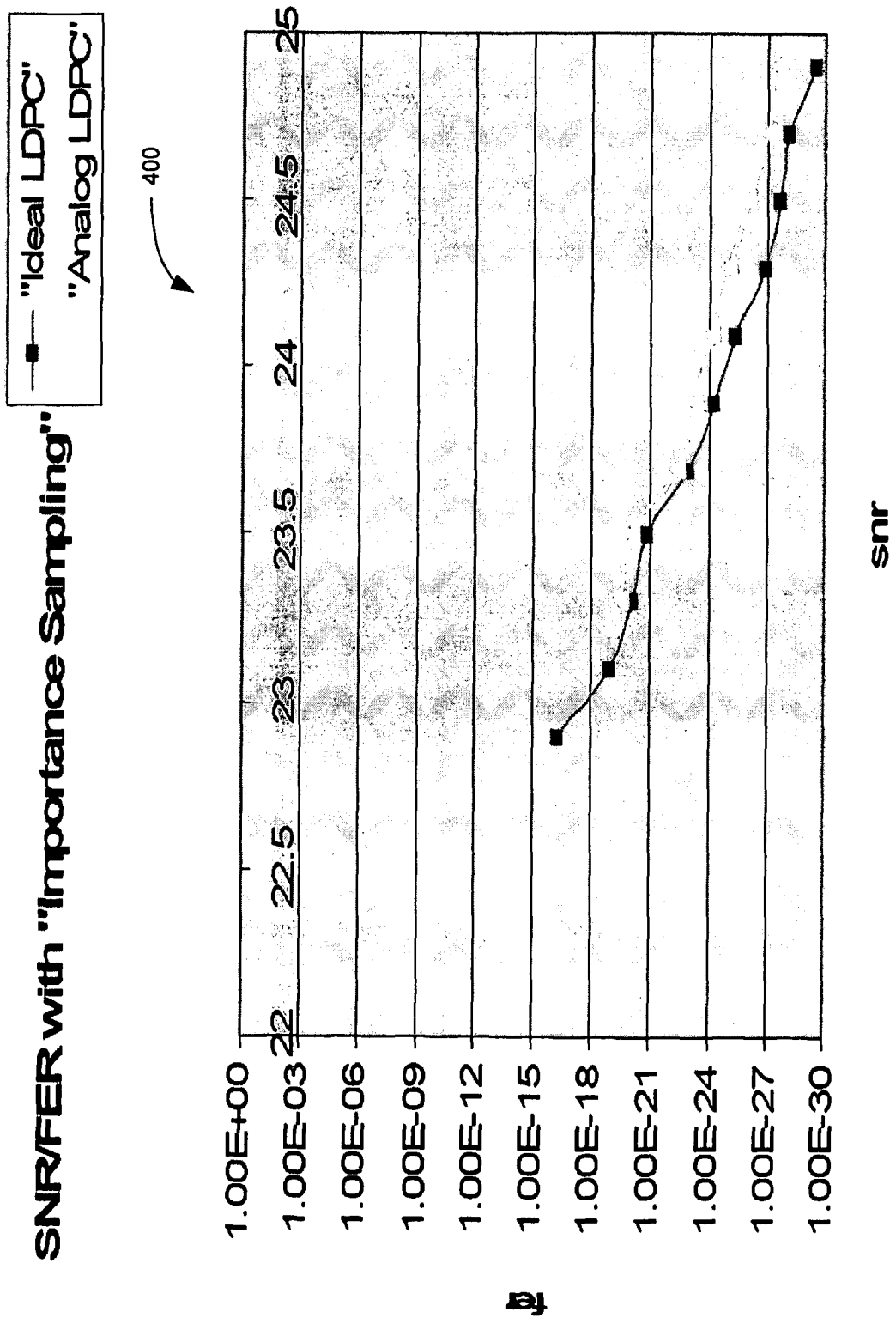
FIG. 4 illustrates a graph of an example error floor behavior as measured using the bit error rate tester of FIG. 3.

In bit error rate testing, a tester generally uses a channel (e.g., channel 304) that represents a worst case channel having, for example, high insertion loss, echo, far-end crosstalk (FEXT), and near-end crosstalk (NEXT). In a case that a worst case channel is not available to a tester, in one implementation, the bit error rate test system 300 further includes a random noise generator 310 that adds noise to the output of the programmable transmitter 302 through a summer 312. Thus, the random noise generator 310 permits the tester to test the behavior of the receiver 306 in the presence of additional noise. Accordingly, a tester (using the random noise generator 310) can manually sweep the received signal-to-noise ratio (SNR) (knowing how much noise is added to the output of the transmitter), and be able to measure (biased) errors at different signal-to-noise ratio (SNR) levels. FIG. 4 illustrates an example graph 400 of the expected unbiased results of a bit error rate as a function of SNR for a single trapping set. As mentioned above, the actual BER vs. SNR curve will be the union of all such curves for all similarly structures trapping sets.

Figure 5:
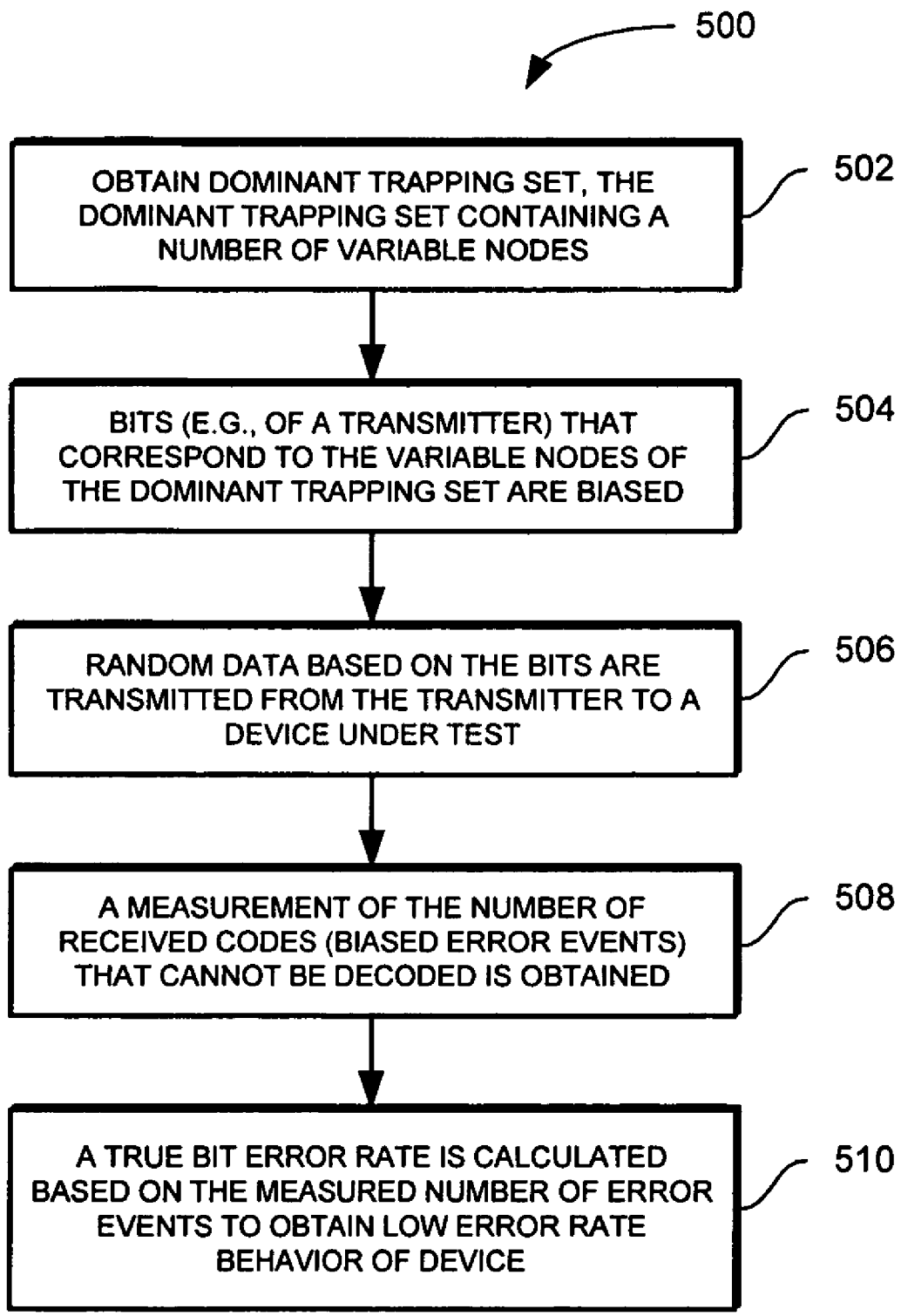
FIG. 5 illustrates a method for performing a bit error rate test in accordance with one implementation.

FIG. 5 illustrates a method 500 for determining low error rate behavior of a device (e.g., a receiver or other circuit or system). A dominant trapping set of a code is obtained (step 502). The code can be an iterative coding scheme such as, for example, low density parity check (LDPC) codes, turbo codes, and the like. The dominant trapping set contains a number of variable nodes for which the erasure of information bits (e.g., errors on all these nodes) has a low probability of being rectified through decoding. Bits associated with a programmable transmitter (e.g. programmable transmitter 302) that correspond to the variable nodes of the dominant trapping set are biased (step 504). In one implementation, the bits are biased with a voltage (e.g., 600 mV or other suitable voltage). In one implementation, the proper bias voltage is determined using importance sampling techniques. Random data is then sent to a device under test (e.g., a receiver) through a channel (step 506). The number of (biased) error events (or the number of received bits that cannot be decoded) are counted (e.g., by a decoder) (step 508). A true bit error rate that corresponds to the low error rate behavior of the device is calculated based on the number of measured error events (step 510). In one implementation, a mathematical transformation is applied to unbias the measured results to obtain the true bit error rate.

One or more of method steps described above can be performed by one or more programmable processors executing a computer program to perform functions by operating on input data and generating output. Generally, the invention can take the form of an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Figure 6:
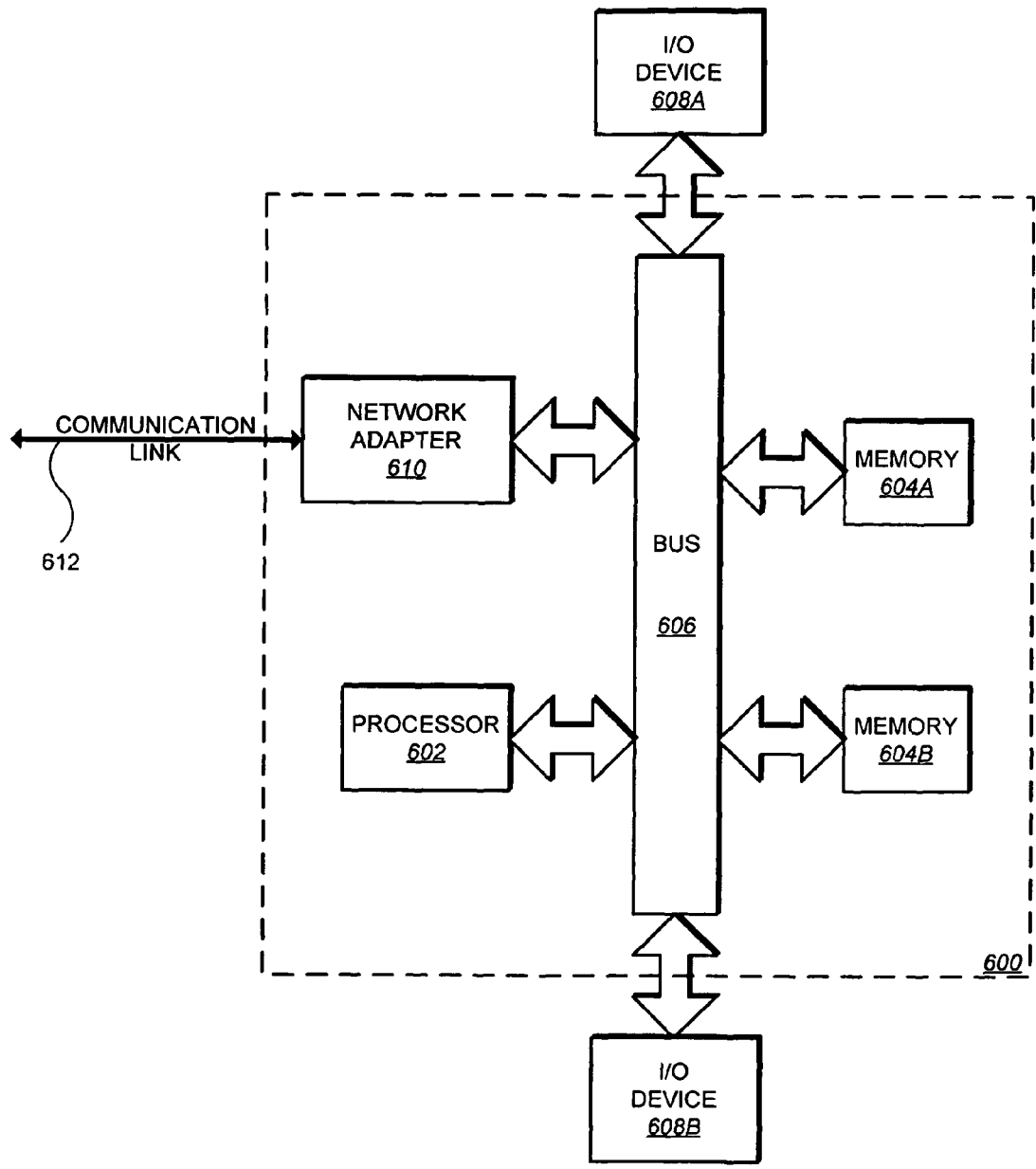
FIG. 6 illustrates a computer system suitable for storing and/or executing program code in accordance with one implementation.

FIG. 6 illustrates a computer system 600 suitable for storing and/or executing program code. The computer system 600 includes a processor 602 coupled to memory elements 604A-B through a system bus 606. In other embodiments, the computer system 600 may include more than one processor and each processor may be coupled directly or indirectly to one or more memory elements through a system bus. The memory elements 604A-B can include local memory employed during actual execution of the program code, bulk storage, and cache memories that provide temporary storage of at least some program code in order to reduce the number of times the code must be retrieved from bulk storage during execution. As shown, input/output or I/O devices 608A-B (including, but not limited to, keyboards, displays, pointing devices, and so on) are coupled to the computer system 600. The I/O devices 608A-B may be coupled to the computer system 600 directly or indirectly through intervening I/O controllers (not shown).

In the implementation shown, a network adapter 610 is coupled to the computer system 600 to enable the computer system 600 to become coupled to other data processing systems (or computer systems) or remote printers or storage devices through a communication link 612. The communication link 612 can be a private or public network. Modems, cable modems, and Ethernet cards are just a few of the currently available types of network adapters.

Various implementations of a bit error rate test system have been described. Nevertheless, various modifications may be made to the implementations, and those modifications would be within the scope of the present invention. For example, the techniques described above can be generally applied to many error coding/decoding applications. The techniques described above can be applied to IC level testing for example the IC level testing of a 10 GBase-T transceiver IC (layer one of the ISO stack) for use in the Ethernet NIC cards or network switches, and characterization, as well as system level testing of the final NIC or Switch product. The usage of the trapping set information in hardware is novel and many hardware or software modifications may be done toward BER testing or hardware improvements. For example, the trapping set information can be used in hardware (at the IC level either in analog or digital); toward expediting the BER testing of the IC or the system; toward performance improvement of the code, or correction of the error events due to trapping sets; and using the trapping set information (or the inherent structure of the trapping sets) to change the variable or parity node behavior (or construction in hardware) toward improvement of the code, correction of the error events, or altering the decoder's convergence algorithm. Accordingly, many modifications may be made without departing from the scope of the present invention.

An important part of the present disclosure is the discovery of the dominant trapping sets as shown in FIGS. 2A-2B, and hardware manipulation of such trapping set. This was obtained through exhaustive computer simulations to understand the error floor failures. The usage of this trapping set information is described above for the purposes of BER testing. Hardware manipulations of such trapping sets are all new art and thus part of this new discovery. For example, the detection of such trapping sets for (2048,1723) code in hardware could help in rectifying these "traps" through specific hardware implementations. An example of hardware manipulation of such trapping sets is described next.

At low SNRs, the error events are generally due to the trapping sets as shown in FIG. 4 (error floor). Once we have an exhaustive list of all the trapping sets (one being similar to FIG. 2A), the corresponding parity checks which participate in the trapping sets are identifiable. One can build a table which enumerates the variable nodes to the corresponding parity nodes for all the trapping sets. Then upon detection of an error event at the output of the LDPC decoder (unit 308 FIG. 3), one would interrogate the table above to see which sets of the parity nodes are not satisfied. The corresponding variable nodes of that parity set is looked up in the table above. Then, those variable nodes are all negated (at the output of the decoder the bits are either 0s or 1s), so as to correct all of the errored bits. This would clean up the error if the errored bits were all part of the trapping sets. This is an example of hardware manipulation of the trapping sets, based on the knowledge of the trapping set construction.

What is claimed is:

1. A bit error rate test system operable to determine low error rate behavior of a device, the bit error rate test system comprising:
a programmable transmitter to send random data via a channel to the device, the random data containing one or more biased bits that correspond to a trapping set of a code, the biased bits having been intentionally biased with a voltage bias that causes a greater number of error events in the device than without the voltage bias;
a decoder in communication with the device, the decoder to measure a number of error events corresponding to received biased bits associated with the random data that cannot be decoded; and
a circuit to calculate a true bit error rate of the device based on the measured number of error events.

2. The system of claim 1, wherein the circuit comprises a field programmable gate array (FPGA).

3. The system of claim 1, wherein the circuit is part of an external computer system that is in communication with the decoder.

4. The system of claim 1, further comprising a random noise generator operable to intentionally add noise to an output of the programmable transmitter, the random noise generator to permit a tester to test the low error rate behavior of the device in the presence of additional noise.

5. The system of claim 1, wherein the device comprises one of a receiver, an integrated circuit, and a system.

6. The system of claim 1, wherein the channel is a worst case channel having one or more of high insertion loss, echo, far-end crosstalk (FEXT), and near-end crosstalk (NEXT).

7. The system of claim 1, wherein the code comprises a turbo code, or a low density parity check (LDPC code).

8. A method for determining low error rate behavior of a device comprising:
obtaining a dominant trapping set of a code, the dominant trapping set containing a plurality of variable nodes;
biasing bits associated with a programmable transmitter that is in communication with the device, the biased bits corresponding to the variable nodes of the dominant trapping set, the biased bits biased with a voltage bias that causes a greater number of error events in the device than without the voltage bias;
transmitting random data from the programmable transmitter to the device, the random data including one or more of the biased bits;
measuring a number of error events corresponding to biased bits received by the device that cannot be decoded; and
determining a true bit error rate of the device based on the measured number of error events.

9. The method of claim 8, wherein obtaining a dominant trapping set of a code includes obtaining a dominant trapping set of a low density parity check (LDPC) code or a turbo code.

10. The method of claim 8, wherein transmitting random data from the programmable transmitter to the device includes transmitting the data though a worst case channel having one or more of high insertion loss, echo, far-end crosstalk (FEXT), and near-end crosstalk (NEXT).

11. The method of claim 8, further comprising intentionally adding additional noise to an output of the programmable transmitter while transmitting the random data to the device.

12. The method of claim 8, wherein determining a true bit error rate of the device based on the measured number of error events includes applying a mathematical transformation to the measured number of error events to obtain the true bit error rate.

13. The method of claim 8, wherein the device comprises one of a receiver, an integrated circuit, and a system.

14. A computer readable medium containing program instruction tangibly stored thereon for determining low error rate behavior of a device, the computer readable medium containing instructions for:
obtaining a dominant trapping set of a code, the dominant trapping set containing a plurality of variable nodes;
biasing bits associated with a programmable transmitter that is in communication with the device, the biased bits corresponding to the variable nodes of the dominant trapping set, the biased bits biased with a voltage bias that causes a greater number of error events in the device than without the voltage bias;

transmitting random data from the programmable transmitter to the device, the random data including one or more of the biased bits;

measuring a number of error events corresponding to biased bits received by the device that cannot be decoded; and determining a true bit error rate of the device based on the measured number of error events.

15. The computer readable medium of claim 14, wherein the instructions for obtaining a dominant trapping set of a code include instructions for obtaining a dominant trapping set of a low density parity check (LDPC) code or a turbo code.

16. The computer readable medium of claim 14, wherein the instructions for transmitting random data from the programmable transmitter to the device include instructions for transmitting the data though a worst case channel having one or more of high insertion loss, echo, far-end crosstalk (FEXT), and near-end crosstalk (NEXT).

17. The computer readable medium of claim 14, further comprising instructions for intentionally adding additional noise to an output of the programmable transmitter while transmitting the random data to the device.

18. The computer readable medium of claim 14, wherein the instructions for determining a true bit error rate of the device based on the measured number of error events include instructions for applying a mathematical transformation to the measured number of error events to obtain the true bit error rate.

19. The computer readable medium of claim 14, wherein the device comprises one of a receiver, an integrated circuit, and a system.

20. A decoder system comprising:

a decoder that receives data, decodes the data, and detects an error event corresponding to one or more bits of the data that cannot be decoded; and a circuit that corrects the one or more bits that cannot be decoded, by using a stored list of one or more trapping sets for the data.

21. The decoder system of claim 20 wherein the circuit that corrects the one or more bits uses the stored list of trapping sets for the data to:

identify parity checks corresponding to the one or more bits that cannot be decoded which participate in the trapping sets; and check the stored list of one or more trapping sets to determine which sets of parity nodes in the list are not satisfied, the sets of parity nodes corresponding to the parity checks.

22. The decoder system of claim 21 wherein the circuit that corrects the one or more bits uses the stored list of trapping sets for the data looks up variable nodes in the list that correspond to the sets of parity nodes and negates the variable nodes to correct the bits corresponding to the variable nodes.

* * * * *